(12) United States Patent
Teranishi

(10) Patent No.: US 12,304,109 B2
(45) Date of Patent: May 20, 2025

(54) METHOD OF SEPARATING WAFER

(71) Applicant: DISCO CORPORATION, Tokyo (JP)

(72) Inventor: Shunsuke Teranishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 284 days.

(21) Appl. No.: 17/663,754

(22) Filed: May 17, 2022

(65) Prior Publication Data

US 2022/0371224 A1    Nov. 24, 2022

(30) Foreign Application Priority Data

May 24, 2021    (JP) ................................. 2021-086991

(51) Int. Cl.
| | |
|---|---|
| B28D 5/00 | (2006.01) |
| B23K 26/00 | (2014.01) |
| B23K 26/402 | (2014.01) |
| B23K 103/00 | (2006.01) |
| H01L 21/02 | (2006.01) |

(52) U.S. Cl.
CPC ........ B28D 5/0011 (2013.01); B23K 26/0093 (2013.01); B23K 26/402 (2013.01); H01L 21/0201 (2013.01); *B23K 2103/56* (2018.08)

(58) Field of Classification Search
CPC .............. B28D 5/0011; B23K 26/0093; B23K 26/402; H01L 21/0201
See application file for complete search history.

(56) References Cited

U.S. PATENT DOCUMENTS

| | | | |
|---|---|---|---|
| 2005/0023260 A1* | 2/2005 | Takyu ............... | H01L 21/67092 |
| | | | 219/121.67 |
| 2006/0076327 A1* | 4/2006 | Kobayashi ............ | B23K 26/40 |
| | | | 219/121.73 |
| 2010/0009549 A1* | 1/2010 | Sekiya .................. | H01L 21/268 |
| | | | 438/795 |
| 2017/0136572 A1 | 5/2017 | Hirata | |

(Continued)

FOREIGN PATENT DOCUMENTS

| CN | 1574235 A | * | 2/2005 | ......... H01L 21/6835 |
|---|---|---|---|---|
| CN | 108115853 A | * | 6/2018 | ............... B28D 5/00 |

(Continued)

OTHER PUBLICATIONS

CN_108115853_A (Year: 2018).*

(Continued)

*Primary Examiner* — Jonathan G Riley
(74) *Attorney, Agent, or Firm* — Greer Burns & Crain Ltd.

(57) ABSTRACT

A method of separating a wafer into at least two thinner wafers includes a pressing member placing step of placing a pressing member that is transmissive of a wavelength of a laser beam on a first surface of the wafer such that the pressing member is pressed against the first surface of the wafer, a separation initiating point forming step of forming a separation initiating point in the wafer by applying the laser beam whose wavelength is transmittable through the wafer to the wafer while positioning a focused spot of the laser beam within the wafer and moving the focused spot and the wafer relatively to each other along a first direction, and an indexing feed step of moving the focused spot and the wafer relatively to each other along a second direction perpendicular to the first direction.

8 Claims, 11 Drawing Sheets

(56) References Cited

U.S. PATENT DOCUMENTS

| | | | |
|---|---|---|---|
| 2018/0308679 A1* | 10/2018 | Hirata | ............... C30B 29/36 |
| 2019/0030651 A1 | 1/2019 | Sekiya | |
| 2019/0304769 A1* | 10/2019 | Hirata | ............ B23K 26/0006 |
| 2020/0266090 A1* | 8/2020 | Harada | ............... H01L 21/78 |
| 2021/0066111 A1 | 3/2021 | Zhao | |
| 2022/0032503 A1* | 2/2022 | Hirata | ............. B23K 26/067 |

FOREIGN PATENT DOCUMENTS

| | | | |
|---|---|---|---|
| CN | 111986986 A * | 11/2020 | ......... B23K 26/53 |
| JP | 2000094221 A | 4/2000 | |
| JP | 2014229702 A | 12/2014 | |
| JP | 2016111143 A | 6/2016 | |
| JP | 2017092314 A | 5/2017 | |
| JP | 2019029382 A | 2/2019 | |
| JP | 2020074468 A | 5/2020 | |
| JP | 2020102520 A | 7/2020 | |
| JP | 2021034704 A | 3/2021 | |
| WO | 2020130109 A1 | 6/2020 | |

OTHER PUBLICATIONS

CN-111986986-A (Year: 2020).*
Office Action issued in counterpart Japanese patent application No. 2021-086991, dated Mar. 4, 2025.

* cited by examiner

METHOD OF SEPARATING WAFER

BACKGROUND OF THE INVENTION

Field of the Invention

The present invention relates to a method of separating a wafer.

Description of the Related Art

Wafers on which to form semiconductor devices are generally sliced from an ingot by a cutting apparatus such as a wire saw and are finished by lapping, polishing, or the like (see, for example, JP 2000-94221A).

However, the process disclosed in JP 2000-94221A is problematic in that since the wire saw produces a large amount of sawdust from the ingot, the process is uneconomical because a substantial percentage of the ingot is wasted.

In view of the foregoing shortcoming, there has been proposed a technology for applying a laser beam whose wavelength is transmittable through the ingot to the ingot while positioning a focused spot of the laser beam within the ingot, thereby forming a peel-off layer in the ingot at a depth corresponding to a thickness of a wafer to be produced from the ingot (see, for example, JP 2016-111143A).

SUMMARY OF THE INVENTION

According to still another process, a wafer is separated from an ingot at a peel-off layer that has been formed in the ingot as a separation initiating point. However, it is not easy to peel off a wafer from an ingot at a peel-off layer acting as a separation initiating point. One solution has been to apply ultrasonic vibrations through a layer of water to the ingot. However, the application of ultrasonic vibrations is highly costly as it requires a large amount of water to be used.

Furthermore, there is a process where the use of water is not desirable, e.g., a process for separating a wafer where devices have been formed on its face side into two thinner wafers. In such a process, it is impossible to peel off a wafer layer with ultrasonic waves because no water is used.

Attempts have been made to process a wafer under conditions involving strong processing forces such that a wafer layer can be peeled off by increased peeling forces. However, as the wafer layer starts to be peeled off and is greatly warped while it is being processed, a new problem has arisen in that the wafer cannot be processed at positions where it is to be processed, tending to result in processing failures such as wafer cracks.

It is therefore an object of the present invention to provide a method of separating a wafer in which it is possible to form a separation initiating point in the wafer at a position where the wafer is to be processed.

In accordance with an aspect of the present invention, there is provided a method of separating a wafer having a first surface and a second surface opposite the first surface into at least two thinner wafers. The method includes a pressing member placing step of placing a pressing member that is transmissive of a wavelength of a laser beam on the first surface of the wafer such that the pressing member is pressed against the first surface of the wafer, after the pressing member placing step, a separation initiating point forming step of forming separation initiating points in the wafer by applying the laser beam whose wavelength is transmittable through the wafer to the wafer while positioning a focused spot of the laser beam within the wafer and moving the focused spot and the wafer relatively to each other along a first direction, and an indexing feed step of moving the focused spot and the wafer relatively to each other along a second direction perpendicular to the first direction.

Preferably, the pressing member includes a tape that is transmissive of the wavelength of the laser beam.

Preferably, the method of separating a wafer further includes a separating step of separating the wafer into the thinner wafer including the first surface and the thinner wafer including the second surface after repeating the separation initiating point forming step and the indexing feed step while holding the wafer on the chuck table, thereby forming the separation initiating points entirely in the wafer, and after the separating step, a grinding step of grinding a surface of the thinner wafer including the second surface held on the chuck table.

In accordance with another aspect of the present invention, there is provided a method of separating a wafer from a semiconductor ingot having a first surface and a second surface opposite the first surface. The method includes a pressing member placing step of placing a pressing member that is transmissive of a wavelength of a laser beam on the first surface of the semiconductor ingot such that the pressing member is pressed against the first surface of the semiconductor ingot, after the pressing member placing step, a separation initiating point forming step of forming separation initiating points in the semiconductor ingot by applying the laser beam whose wavelength is transmittable through the semiconductor ingot to the semiconductor ingot while positioning a focused spot of the laser beam within the semiconductor ingot and moving the focused spot and the semiconductor ingot relatively to each other along a first direction, and an indexing feed step of moving the focused spot and the semiconductor ingot relatively to each other along a second direction perpendicular to the first direction, in which the separation initiating point forming step includes a step of branching the laser beam into a plurality of laser beams arrayed along the second direction perpendicular to the first direction.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described above. Furthermore, the arrangements described below can be combined in appropriate manners. Various omissions, replacements, or changes of the arrangements may be made without departing from the scope of the present invention. In the description to be described below, those components that are identical to each other are denoted by identical reference signs, and will be omitted from description.

First Embodiment

Figure 1:
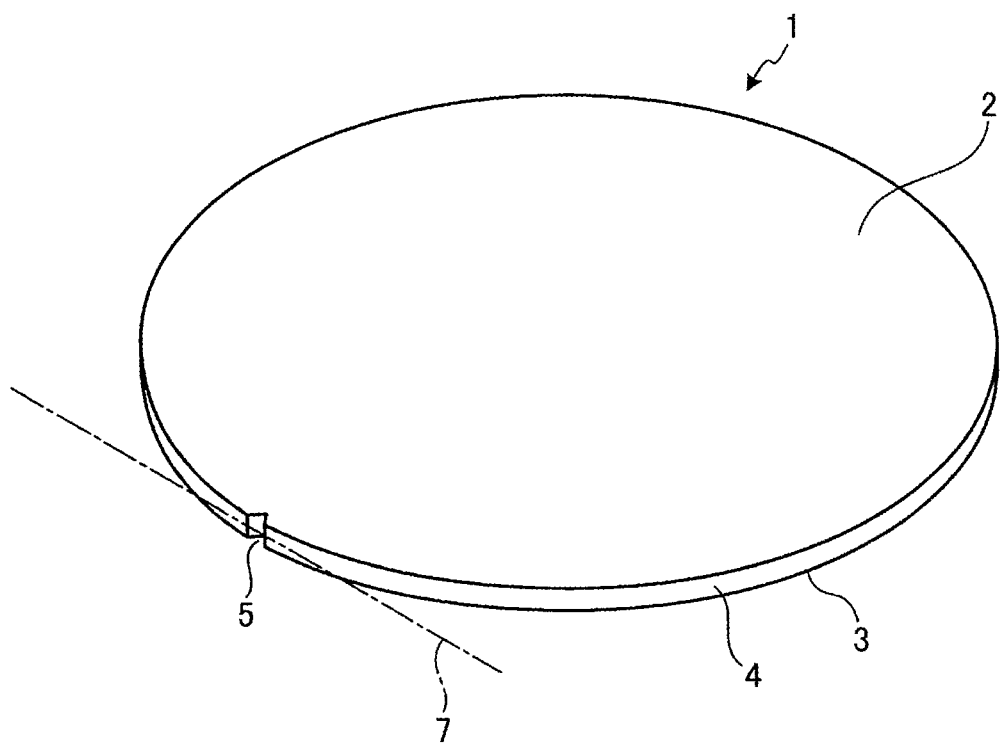
FIG. 1 is a perspective view of a wafer as a target to be processed by a method of separating a wafer according to a first embodiment of the present invention.

A method of separating a wafer according to a first embodiment of the present invention will be described in detail below with reference to the accompanying drawings. The method of separating a wafer according to the first embodiment processes a wafer 1 illustrated in FIG. 1. First, the wafer 1 as a target to be processed by the method of separating a wafer according to the first embodiment will be described below. FIG. 1 illustrates, in perspective, the wafer 1 as a target to be processed by the method of separating a wafer according to the first embodiment.
(Wafer)

The wafer 1 as a target to be processed by the method of separating a wafer according to the first embodiment is made of silicon. The wafer 1 is shaped as a circular plate in its entirety, having a circular flat first surface 2, a circular flat second surface 3 opposite the first surface 2, and a circumferential surface 4 extending around and contiguous to the outer circumferential edges of the first surface 2 and the second surface 3. The first surface 2 and the second surface 3 lie parallel to each other. The wafer 1 also has a notch 5 defined in the circumferential surface 4 as indicating the crystal orientation of the wafer 1. According to the first embodiment, the wafer 1 is 775 μm thick.
(Method of Separating a Wafer)

Figure 2:
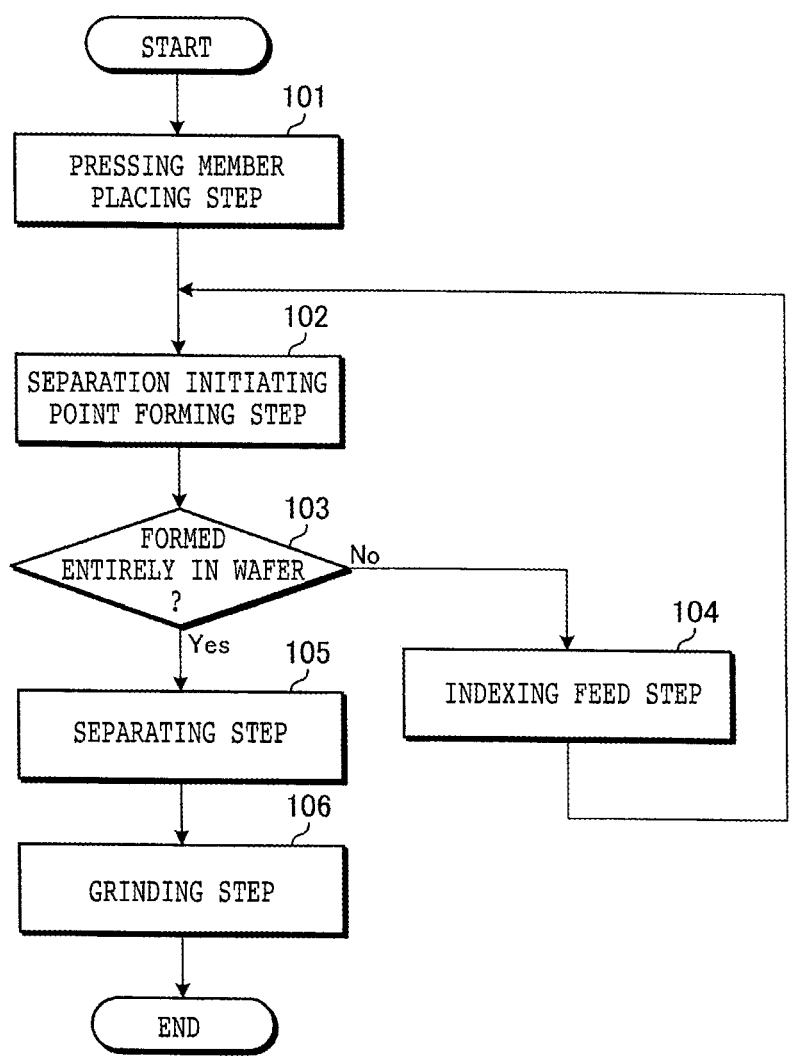
FIG. 2 is a flowchart of a sequence of the method of separating a wafer according to the first embodiment.

The method of separating a wafer will be described below. FIG. 2 is a flowchart of a sequence of the method of separating a wafer according to the first embodiment. The method of separating a wafer according to the first embodiment separates the wafer 1 illustrated in FIG. 1 into at least two thinner wafers. As illustrated in FIG. 2, the method includes a pressing member placing step 101, a separation initiating point forming step 102, an indexing feed step 104, a separating step 105, and a grinding step 106.
(Pressing Member Placings Step)

Figure 3:
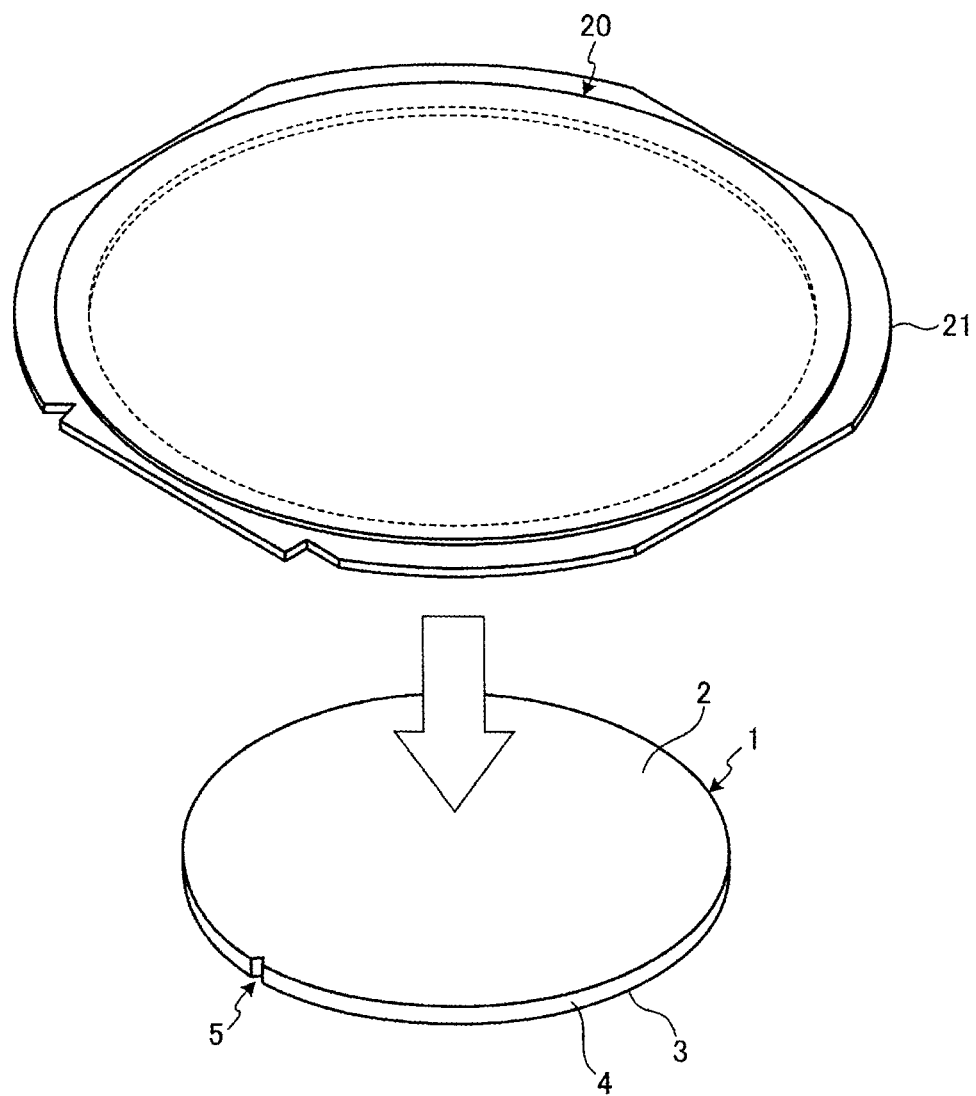
FIG. 3 is a perspective view schematically illustrating a pressing member placing step of the method of separating a wafer illustrated in FIG. 2.

FIG. 3 schematically illustrates, in perspective, the pressing member placing step 101 of the method of separating a wafer illustrated in FIG. 2. The pressing member placing step 101 is the step of placing a tape 20 as a pressing member that is transmissive of the wavelength of a laser beam 31 illustrated in FIG. 4 that is applied to the wafer 1 in the separation initiating point forming step 102, on the first surface 2 of the wafer 1 such that the tape 20 is pressed against the first surface 2 of the wafer 1 prior to the separation initiating point forming step 102.

According to the first embodiment, as illustrated in FIG. 3, the tape 20 that is shaped as a circular plate is larger in diameter than the wafer 1 and has an outer edge portion affixed to an annular frame 21 whose inside diameter is larger than the diameter of the wafer 1. In the pressing member placing step 101, the tape 20 has a central portion affixed to the first surface 2 of the wafer 1. According to the first embodiment, the tape 20 is made of an adhesive and flexible resin and includes an adhesive layer affixed to the wafer 1 and the frame 21 and a base layer made of a resin that is non-adhesive and flexible on which the adhesive layer is layered. According to the first embodiment, the tape 20 acts as a pressing member to be pressed against the first surface 2 of the wafer 1.
(Separation Initiating Point Forming Step)

Figure 4:
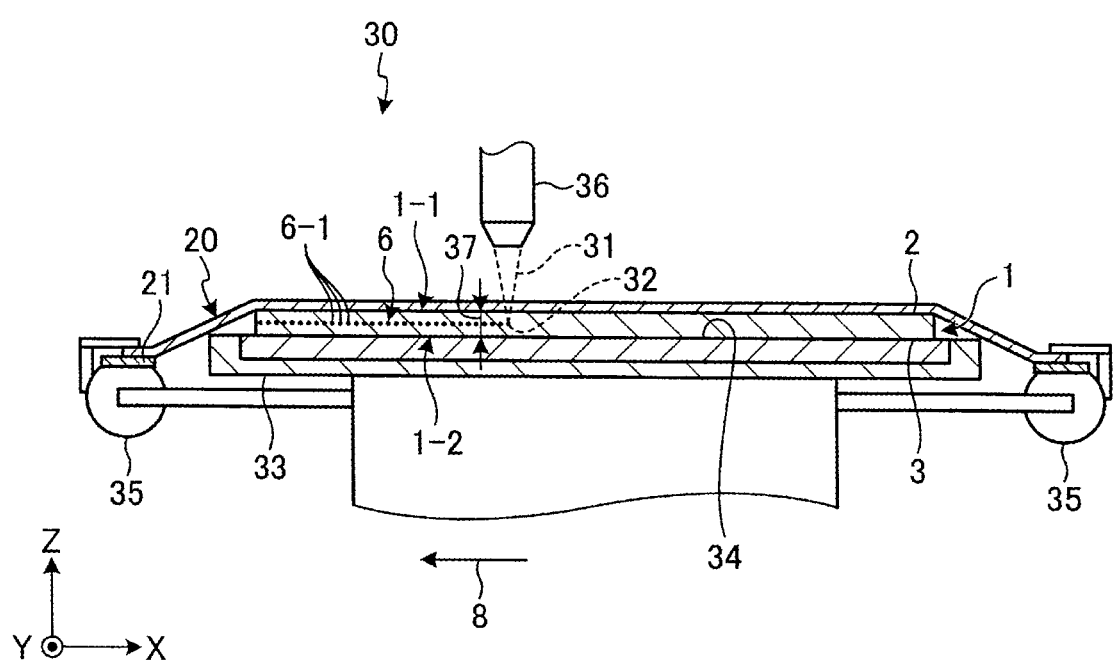
FIG. 4 is a side elevational view, partly in cross section, schematically illustrating a separation initiating point forming step of the method of separating a wafer illustrated in FIG. 2.
Figure 5:
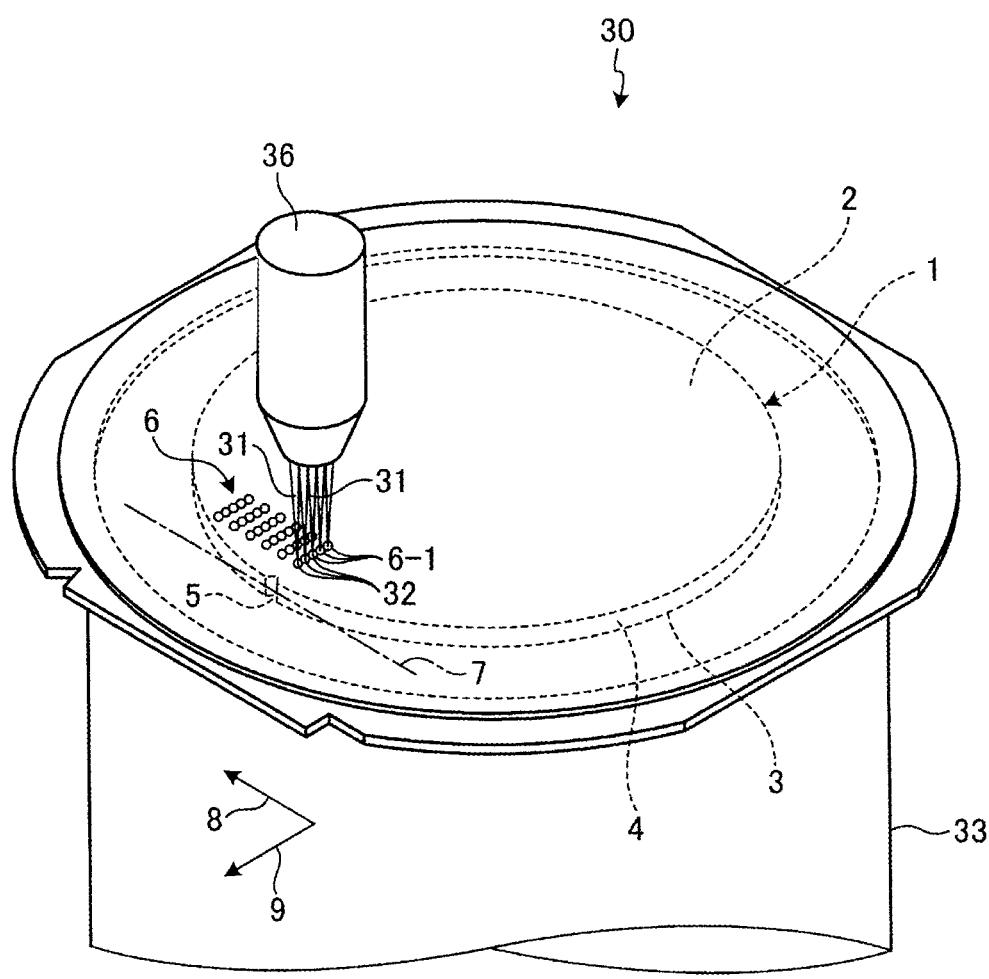
FIG. 5 is a perspective view schematically illustrating the separation initiating point forming step of the method of separating a wafer illustrated in FIG. 2.

FIG. 4 schematically illustrates, in side elevation, partly in cross section, the separation initiating point forming step 102 of the method of separating a wafer illustrated in FIG. 2. FIG. 5 schematically illustrates, in perspective, the separation initiating point forming step 102 of the method of separating a wafer illustrated in FIG. 2. The separation initiating point forming step 102 is the step of forming a peel-off layer 6, to be described later, as a separation initiating point in the wafer 1 by applying the laser beam 31 whose wavelength is transmittable through the wafer 1 to the wafer 1 while positioning a focused spot 32 of the laser beam 31 within the wafer 1 and moving the focused spot 32 and the wafer 1 relatively to each other along a first direction 8.

Details of the separation initiating point forming step 102 according to the first embodiment will be described below. According to the first embodiment, in the separation initiating point forming step 102, a processing apparatus 30 illustrated in FIG. 4 holds the second surface 3 of the wafer 1 under suction on a holding surface 34 of a rotatable chuck table 33 and grips the frame 21 with a plurality of clamps 35 disposed around the chuck table 33. At this time, according to the first embodiment, the tape 20 is positioned upwardly of the wafer 1. According to the first embodiment, in the separation initiating point forming step 102, the processing apparatus 30 illustrated in FIG. 4 captures an image of the wafer 1 held on the chuck table 33 with an image capturing unit and performs an alignment process for positioning a laser beam applying unit 36 that emits the laser beam 31 and the wafer 1 with respect to each other on the basis of the captured image. The laser beam applying unit 36 includes a laser oscillator, not depicted, for emitting the laser beam 31 and a beam branching unit, not depicted, for branching the laser beam 31.

According to the first embodiment, in the separation initiating point forming step 102, the processing apparatus 30 positions the laser beam applying unit 36 above an end of the outer circumferential edge of the wafer 1 along an X-axis direction indicated by an arrow X that is also referred to as a processing feed direction, and also orients a line 7, indicated by the dot-and-dash line in FIG. 1, tangential to the circumferential surface 4 of the wafer 1 held on the chuck table 33 at a position where the notch 5 is defined, parallel to the X-axis direction. The processing feed direction represents a direction along which the processing apparatus 30 moves the chuck table 33 while applying the laser beam 31 emitted from the laser beam applying unit 36 to the wafer 1.

In the separation initiating point forming step 102, the processing apparatus 30 sets the focused spot 32 in the wafer 1 at a depth 37 from the first surface 2 that corresponds to the thickness of a thinner wafer 1-1 including the first surface 2 to be separated from the wafer 1, and applies the laser beam 31 whose wavelength is transmittable through the tape 20 and the wafer 1 from the laser beam applying unit 36 to the wafer 1 while horizontally moving the chuck table 33 along the first direction 8 parallel to the tangential line 7 until the diametrically opposite end of the outer circumferential edge of the wafer 1 along the X-axis direction indicated by the arrow X comes to a position below the laser beam applying unit 36. In the separation initiating point forming step 102, the beam branching unit of the laser beam applying unit 36 branches the laser beam 31 emitted from the laser oscillator into a plurality of laser beams 31 and applies the branched laser beams 31 to the wafer 1 while positioning respective focused spots 32 thereof (see FIG. 5) within the wafer 1 and arraying the focused spots 32 along a second direction 9 perpendicular to the first direction 8. The clamps 35 are omitted from illustration in FIG. 5.

In the separation initiating point forming step 102, when the wafer 1 is irradiated with the laser beams 31 branched from the laser beam 31 while their focused spots 32 are being positioned within the wafer 1, a peel-off layer 6 is formed in the wafer 1 in the vicinity of the focused spots 32. The peel-off layer 6 includes modified portions 6-1 and cracks extending from the modified portions 6-1. When the processing apparatus 30 has formed the peel-off layer 6 in the wafer 1 all the way from one end to the diametrically opposite end of the outer circumferential edge of the wafer 1 along the X-axis direction indicated by the arrow X, the laser beam applying unit 36 stops applying the laser beam 31 to the wafer 1.

The processing apparatus 30 includes a control unit, not depicted, that determines whether the peel-off layer 6 has been formed entirely in the wafer 1 at the depth 37 referred to above or not (step 103). The peel-off layer 6 that has been formed entirely in the wafer 1 at the depth 37 means the modified portions 6-1 that are formed at intervals allowing the wafer 1 to be separated or peeled off into the thinner wafer 1-1 including the first surface 2 and another thinner wafer 1-2 including the second surface 3 without external forces applied to the wafer 1. If the control unit, not depicted, of the processing apparatus 30 determines that the peel-off layer 6 has not been formed entirely in the wafer 1 at the depth 37 (step 103: No), then the sequence of the method goes to the indexing feed step 104.

(Indexing Feed Step)

Figure 6:
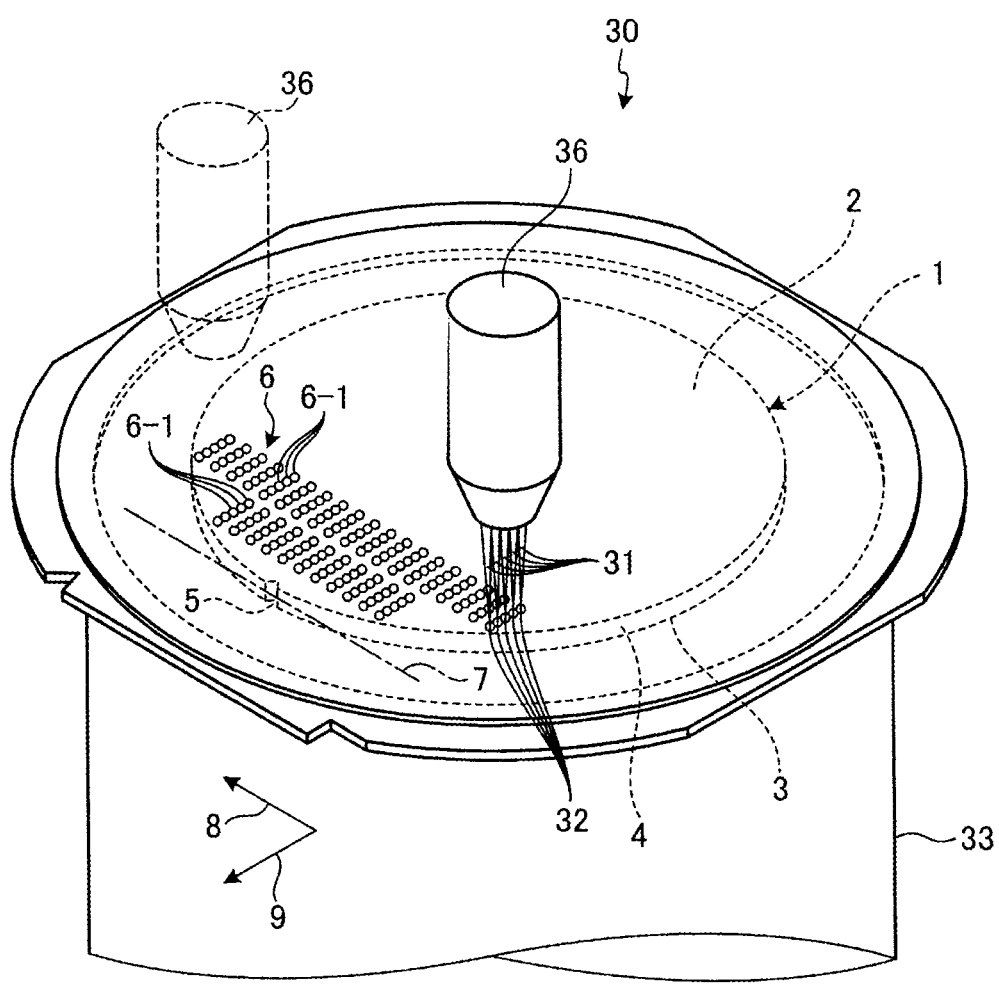
FIG. 6 is a perspective view schematically illustrating a separation initiating point forming step performed after a first cycle of an indexing feed step of the method of separating a wafer illustrated in FIG. 2.
Figure 6:
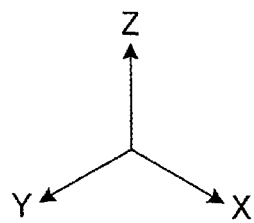

FIG. 6 schematically illustrates, in perspective, the separation initiating point forming step performed after a first cycle of an indexing feed step of the method of separating a wafer illustrated in FIG. 2.

The indexing feed step 104 is the step of moving the focused spots 32 and the wafer 1 relatively to each other in the second direction 9 perpendicular to the first direction 8. In the indexing feed step 104, as illustrated in FIG. 6, the processing apparatus 30 moves the chuck table 33 in the second direction 9, i.e., a Y-axis direction indicated by an arrow Y, and also in the first direction 8, i.e., the X-axis direction to position the laser beam applying unit 36 at a position indicated by the dot-and-dash lines in FIG. 6, adjacent to the peel-off layer 6 already formed in the wafer 1 and above an end of the outer circumferential edge of the wafer 1 along the X-axis direction. In the indexing feed step 104, the processing apparatus 30 also orients the line 7 extending along the first direction 8 and tangential to the circumferential surface 4 of the wafer 1 held on the chuck table 33, at the position where the notch 5 is defined, parallel to the X-axis direction. Then, the sequence of the method goes from the indexing feed step 104 to the separation initiating point forming step 102.

In the separation initiating point forming step 102, as with the preceding cycle of the separation initiating point forming step 102, the processing apparatus 30 sets the focused spots 32 at the depth 37, and applies the branched laser beams 31 from the laser beam applying unit 36 to the wafer 1 while moving the chuck table 33 along the first direction 8 until the diametrically opposite end of the outer circumferential edge of the wafer 1 along the X-axis direction comes to a position below the laser beam applying unit 36, thereby forming a peel-off layer 6 including modified portions 6-1 and cracks in the wafer 1. When the processing apparatus 30 has formed the peel-off layer 6 in the wafer 1 all the way from one end to the diametrically opposite end of the outer circumferential edge of the wafer 1 along the X-axis direction, the laser beam applying unit 36 stops applying the laser beam 31 to the wafer 1.

The control unit of the processing apparatus 30 determines whether the peel-off layer 6 has been formed entirely in the wafer 1 at the depth 37 or not (step 103). If the control unit determines that the peel-off layer 6 has not been formed entirely in the wafer 1 at the depth 37 (step 103: No), then the sequence of the method goes to the indexing feed step 104. After the processing apparatus 30 has performed the index feed step 104, the processing apparatus 30 performs the separation initiating point forming step 102.

The processing apparatus 30 repeats the index feed step 104 and the separation initiating point forming step 102 until the peel-off layer 6 is formed entirely in the wafer 1 at the depth 37. According to the first embodiment, the processing apparatus 30 performs the index feed step 104 and the separation initiating point forming step 102 under typical processing conditions set forth below.

Wavelength of the laser beam 31: 1342 nm
Repetitive frequency of the laser beam 31: 60 kHz
Average output power of the laser beam 31 before being branched: 2.0 W
Number of branched laser beams 31: 5
Processing feed speed: 420 mm/s
Indexing interval: 50 μm The indexing interval represents the distance that the laser beam applying unit 36 and the chuck table 33 are moved relatively to each other in the Y-axis direction in the indexing feed step 104.

If the control unit of the processing apparatus 30 determines that the peel-off layer 6 has been formed entirely in the wafer 1 at the depth 37 (step 103: Yes), then the sequence of the method goes to the separating step 105. Since the peel-off layer 6 formed entirely in the wafer 1 includes the modified portions 6-1 and the cracks, the wafer 1 can easily be separated into the thinner wafer 1-1 including the first surface 2 and the thinner wafer 1-2 including the second surface 3 at the peel-off layer 6 acting as a separation initiating point, i.e., a boundary.

In the separation initiating point forming step 102, furthermore, the laser beams 31 are applied through the tape 20 to the wafer 1 to form the peel-off layer 6 in the wafer 1. Therefore, the laser beams 31 are applied to the wafer 1 to form the peel-off layer 6 in the wafer 1 while the wafer 1 is being pressed against the holding surface 34 of the chuck table 33 by the tape 20.

(Separating Step)

Figure 7:
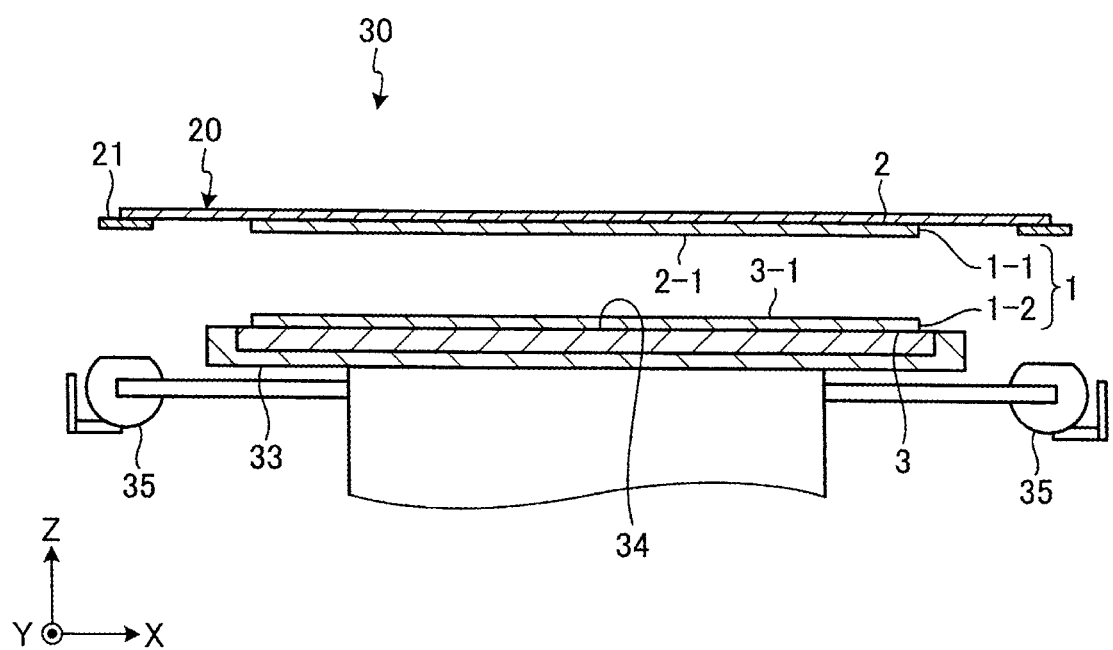
FIG. 7 is a side elevational view, partly in cross section, schematically illustrating a separating step of the method of separating a wafer illustrated in FIG. 2.

FIG. 7 schematically illustrates, in side elevation, partly in cross section, the separating step 105 of the method of separating a wafer illustrated in FIG. 2. The separating step 105 is the step of separating the wafer 1 into the thinner wafer 1-1 including the first surface 2 and the thinner wafer 1-2 including the second surface 3 after repeating the separation initiating point forming step 102 and the indexing feed step 104 while holding the wafer 1 on the chuck table 33, thereby forming the peel-off layer 6 as a separation initiating point entirely in the wafer 1.

According to the present embodiment, in the separating step 105, while the processing apparatus 30 is holding the second surface 3 of the wafer 1 under suction on the chuck table 33, the clamps 35 release the frame 21 and a delivery unit, not depicted, holds the frame 21 and lifts the frame 21 and the tape 20 in a direction away from the holding surface 34 of the chuck table 33. As illustrated in FIG. 7, the wafer 1 is now separated into the thinner wafer 1-1 including the first surface 2 affixed to the tape 20 and the thinner wafer 1-2 including the second surface 3 held under suction on the chuck table 33 at the peel-off layer 6 as a separation initiating point.

(Grinding Step)

Figure 8:
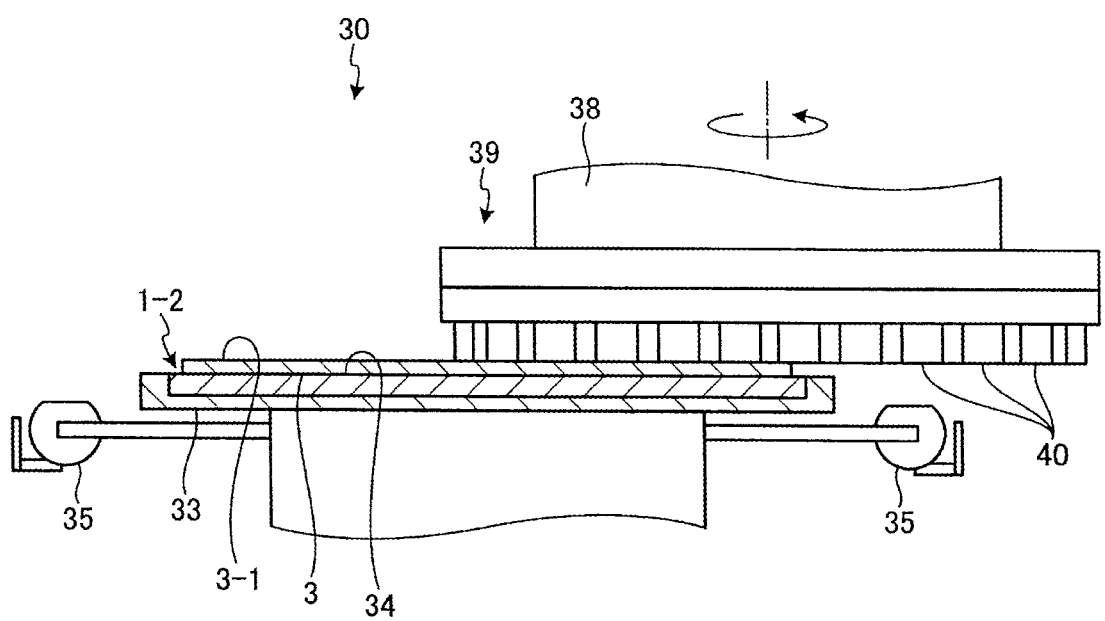
FIG. 8 is a side elevational view, partly in cross section, schematically illustrating a grinding step of the method of separating a wafer illustrated in FIG. 2.

FIG. 8 schematically illustrates, in side elevation, partly in cross section, the grinding step 106 of the method of separating a wafer illustrated in FIG. 2. The grinding step 106 is the step of grinding a surface 3-1 of the thinner wafer 1-2 held on the chuck table 33 after the separating step 105. The surface 3-1 is a peeled-off surface of the thinner wafer 1-2 that has been peeled off from the thinner wafer 1-1.

According to the first embodiment, as illustrated in FIG. 8, the processing apparatus 30 further includes a rotatable spindle 38 with a grinding wheel 39 mounted on a lower end thereof and an annular array of grindstones 40 mounted on a lower surface of the grinding wheel 39. In the grinding step 106, the spindle 38 is rotated about its central axis, rotating the grinding wheel 39 about its central axis, and the chuck table 33 is rotated about its central axis. While a grinding fluid such as pure water is being supplied to the surface 3-1 of the thinner wafer 1-2, the grindstones 40 on the grinding wheel 39 are brought into abrasive contact with the surface 3-1 of the thinner wafer 1-2 and moved at a predetermined feed speed toward the chuck table 33, thereby grinding and planarizing the surface 3-1 of the thinner wafer 1-2.

According to the first embodiment, the same chuck table 33 of the processing apparatus 30 is used throughout the separation initiating point forming step 102 and the indexing feed step 104 to form the peel-off layer 6 in the wafer 1 and grind the surface 3-1 of the thinner wafer 1-2 without releasing the wafer 1 or the thinner wafer 1-2 from the holding surface 34 of the chuck table 33. If the thinner wafer 1-2 is released from the holding surface 34 of the chuck table 33, then the thinner wafer 1-2 would tend to be warped. Since cracks remain on and in the thinner wafer 1-2 after the thinner wafer 1-1 has been peeled off therefrom, the cracks would extend upon warpage of the thinner wafer 1-2, tending to cause the thinner wafer 1-2 to break.

According to the first embodiment, as the peel-off layer 6 is formed in the wafer 1 and the surface 3-1 of the thinner wafer 1-2 is ground and planarized without releasing the wafer 1 or the thinner wafer 1-2 from the holding surface 34 of the chuck table 33 throughout the separation initiating point forming step 102 and the indexing feed step 104. Consequently, cracks on and in the thinner wafer 1-2 are prevented from extending, preventing the thinner wafer 1-2 from breaking.

The thinner wafer 1-1 including the first surface 2 that has been separated from the wafer 1 at the peel-off layer 6 has a peeled-off surface 2-1 that has been peeled off from the thinner wafer 1-2 including the second surface 3. The peeled-off surface 2-1 is ground and planarized by another grinding apparatus or the like.

The method of separating a wafer according to the first embodiment offers the following advantages. The laser beam 31 is applied to the wafer 1 while the tape 20 is pressing the wafer 1 against the holding surface 34 of the chuck table 33. Therefore, after the peel-off layer 6 has been formed in the wafer 1, the thinner wafer 1-2 including the second surface 3, in particular, is prevented from being warped, and the peel-off layer 6 can be formed at an appropriate position in the wafer 1. As a result, the wafer 1 suffers reduced processing failures such as cracks, and the peel-off layer 6 can be formed as a separation initiating point at an appropriate position in the wafer 1.

Furthermore, the peel-off layer 6 can appropriately be formed in the wafer 1 without being adversely affected by warpage under processing conditions involving strong processing forces. It is not necessary to apply ultrasonic vibrations through water to the wafer 1. The wafer 1 can be separated at the peel-off layer 6 as a separation initiating point simply by lifting the tape 20 away from the holding surface 34 of the chuck table 33. Consequently, the wafer 1 can easily be separated into the thinner wafers 1-1 and 1-2.

Second Embodiment

Figure 9:
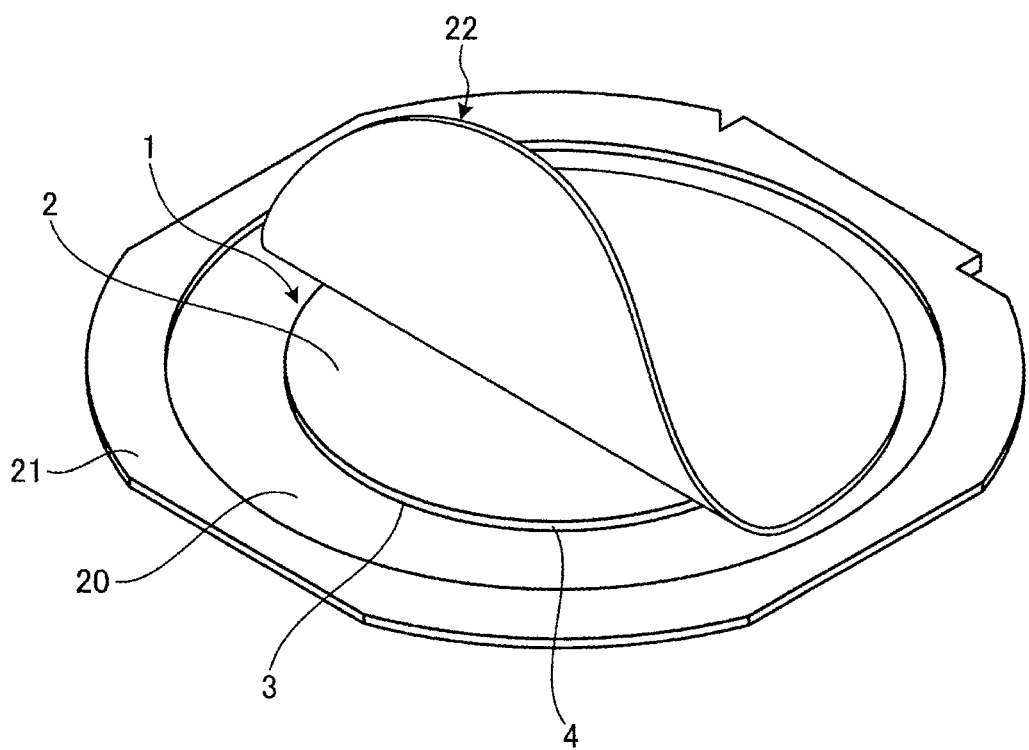
FIG. 9 is a perspective view schematically illustrating a pressing member placing step of a method of separating a wafer according to a second embodiment of the present invention.
Figure 10:
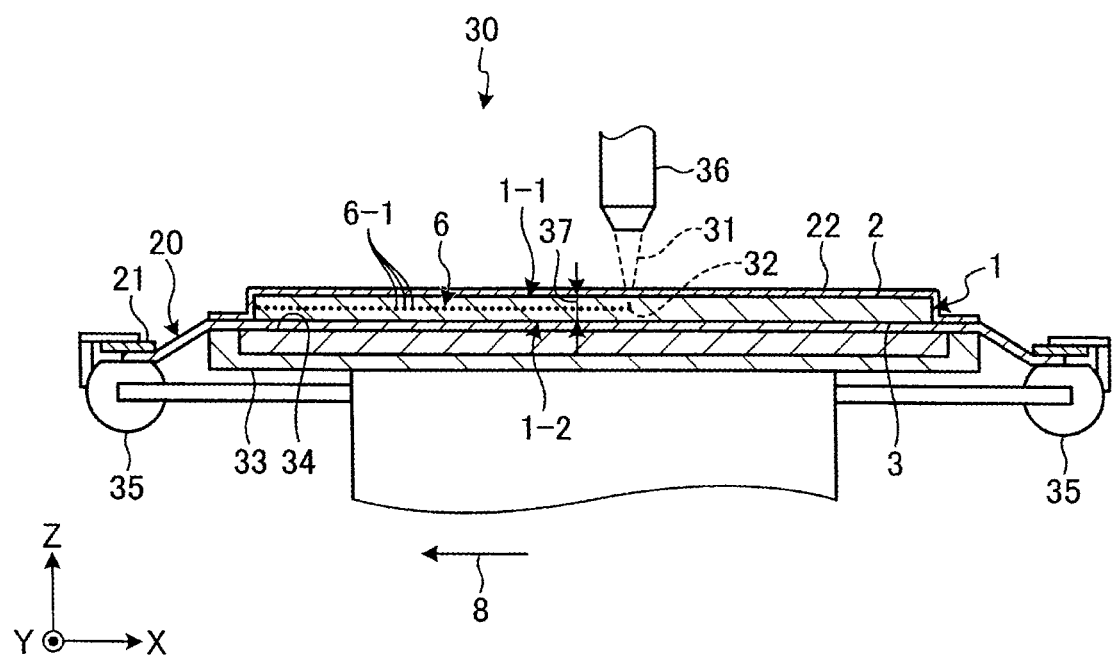
FIG. 10 is a side elevational view, partly in cross section, schematically illustrating a separation initiating point forming step of the method of separating a wafer according to the second embodiment.

A method of separating a wafer according to a second embodiment of the present invention will be described in detail below with reference to the accompanying drawings. FIG. 9 schematically illustrates, in perspective, the pressing member placing step 101 of the method of separating a wafer illustrated according to the second embodiment. FIG. 10 schematically illustrates, in side elevation, partly in cross section, the separation initiating point forming step 102 of the method of separating a wafer according to the second embodiment. Those parts illustrated in FIGS. 9 and 10 that are identical to those according to the first embodiment are denoted by identical reference signs, and will be omitted from description.

The method of separating a wafer according to the second embodiment is similar to the method of separating a wafer according to the first embodiment except that a second tape 22 is used as a pressing member in addition to the tape 20.

In the pressing member placing step 101 of the method of separating a wafer according to the second embodiment, as illustrated in FIG. 9, the tape 20 whose outer edge portion affixed to the annular frame 21 has a central portion affixed to the second surface 3 of the wafer 1, and a second tape 22 whose diameter is larger than the diameter of the wafer 1 and smaller than the inside diameter of the annular frame 21 has a central portion affixed to the first surface 2 of the wafer 1.

The second tape 22 has an outer edge portion affixed to the tape 20. The second tape 22 presses the first surface 2 of the wafer 1. It is sufficient if the second tape 22 is made of a resin that is non-adhesive and flexible and is transmissive of the wavelength of the laser beam 31.

According to the second embodiment, in the separation initiating point forming step 102, as illustrated in FIG. 10, the processing apparatus 30 holds the second surface 3 of the wafer 1 under suction on the holding surface 34 of the chuck table 33 with the tape 20 interposed therebetween, and applies the laser beam 31 to the wafer 1 through the second tape 22, forming a peel-off layer 6 in the wafer 1. According to the second embodiment, in the separation initiating point forming step 102, the laser beam 31 is applied to the wafer 1 while the second tape 22 is pressing the wafer 1 against the holding surface 34 of the chuck table 33.

As described above, the laser beam 31 is applied to the wafer 1 while the second tape 22 is pressing the wafer 1 against the holding surface 34 of the chuck table 33. Therefore, after the peel-off layer 6 has been formed in the wafer 1, the thinner wafer 1-2 including the second surface 3, in particular, is prevented from being warped, and the peel-off layer 6 can be formed at an appropriate position in the wafer 1. As a result, the wafer 1 suffers reduced processing failures such as cracks, and the peel-off layer 6 can be formed as a separation initiating point at an appropriate position in the wafer 1, as with the first embodiment.

According to the second embodiment, furthermore, the peel-off layer 6 can appropriately be formed in the wafer 1 without being adversely affected by warpage under processing conditions involving strong processing forces. It is not necessary to apply ultrasonic vibrations through water to the wafer 1. The wafer 1 can be separated at the peel-off layer 6 as a separation initiating point simply by peeling off the second tape 22 from the tape 20 and lifting the second tape 22 away from the wafer 1. Consequently, the wafer 1 can easily be separated into the thinner wafers 1-1 and 1-2.

In the methods of separating a wafer according to the first and second embodiments, the laser beam 31 is applied to the wafer 1 to form the peel-off layer 6 including the modified portions 6-1 and the cracks in the wafer 1 while the chuck table 33 is being horizontally moved along the first direction 8 parallel to the tangential line 7 at the notch 5. According to the present invention, however, the first direction 8 may be inclined 45° to the tangential line 7 at the notch 5, and the laser beam 31 may be applied to the wafer 1 to form the peel-off layer 6 including the modified portions 6-1 and the cracks in the wafer 1 while the chuck table 33 is being horizontally moved along the first direction 8 thus inclined. Moving the chuck table 33 along the inclined first direction 8 at the time of forming the peel-off layer 6 in the wafer 1 makes it easy for the cracks to extend in the wafer 1, allowing the indexing interval to increase and hence reducing the period of time required to process the wafer 1.

[Modifications]

Figure 11:
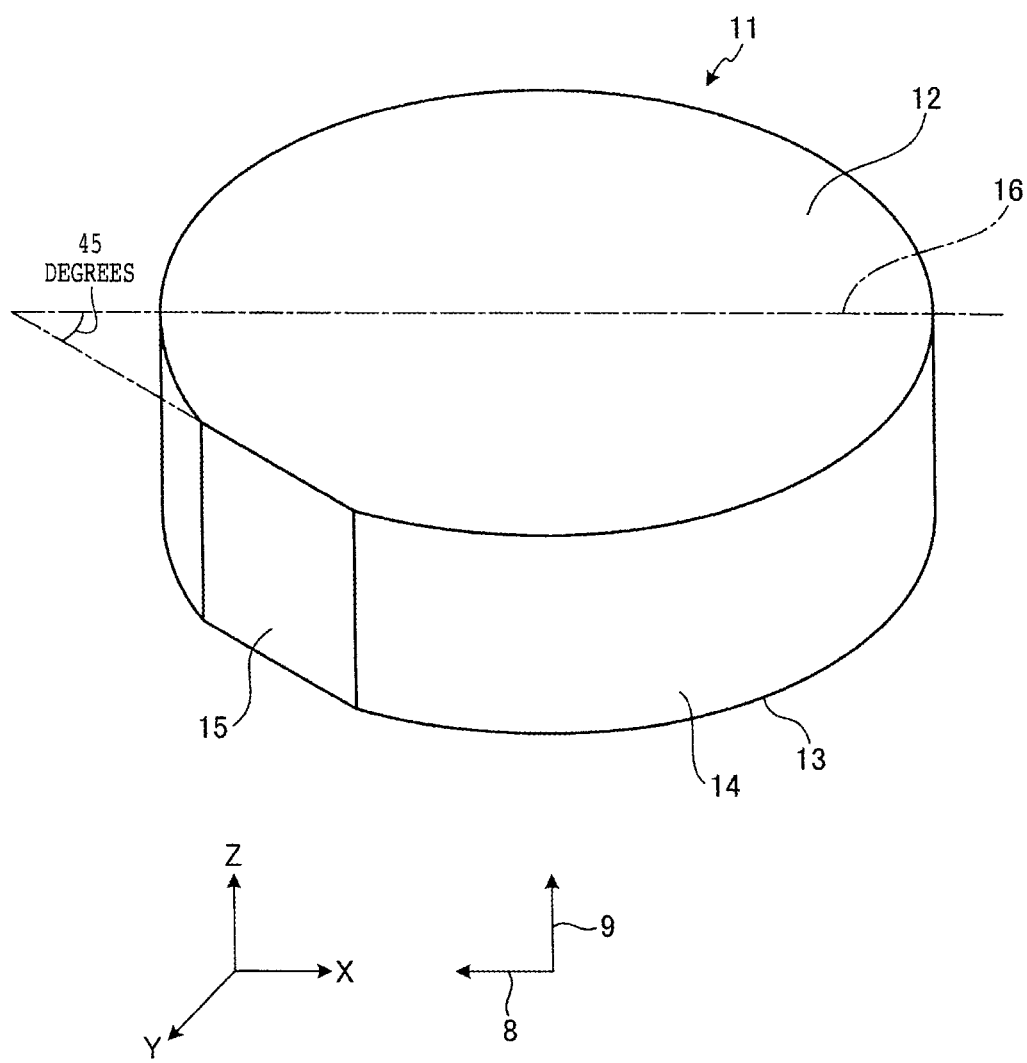
FIG. 11 is a perspective view of an Si ingot as a target to be processed by a method of separating a wafer according to a modification of the first and second embodiments.

A method of separating a wafer according to a modification of the first and second embodiments will be described below with reference to the drawings. FIG. 11 schematically illustrates, in perspective, an Si ingot 11 as a target to be processed by the method of separating a wafer according to the modification of the first and second embodiments. Those parts illustrated in FIG. 11 that are identical to those according to the first embodiment are denoted by identical reference signs and will be omitted from description. The target to be processed according to the modification is not limited to the Si ingot 11 but is also applicable to other semiconductor ingots.

The method of separating a wafer according to the modification applies to the Si ingot 11 illustrated in FIG. 11 as a target to be processed, and separates a portion of the Si ingot 11 that includes a first surface 12 thereof, as a wafer. The Si ingot 11 illustrated in FIG. 11 is made of silicon (Si) and is of a cylindrical shape in its entirety. According to the modification, the Si ingot 11 has a circular flat first surface 12, a circular flat second surface 13 opposite the first surface 12, and a circumferential surface 14 extending around and contiguous to the outer circumferential edges of the first surface 12 and the second surface 13. The first surface 12 lies in a crystallographic plane {100}. The Si ingot 11 also has a flat rectangular orientation flat 15 defined in the circumferential surface 14 as indicating the crystal orientation of the Si ingot 11.

The method of separating a wafer according to the modification includes the separation initiating point forming step 102 and is carried by the processing apparatus 30. In the separation initiating point forming step 102, the Si ingot 11 is held under suction on the holding surface 34 of the chuck table 33, and has its orientation adjusted such that the orientation flat 15 is inclined 45° to the X-axis direction. In the separation initiating point forming step 102 according to the method of separating a wafer according to the modification, the laser beam 31 is applied to the first surface 12 of the Si ingot 11 while the chuck table 33 is being moved in the X-axis direction, i.e., the first direction 8, forming a peel-off layer 6 within the Si ingot 11.

In the separation initiating point forming step 102 according to the method of separating a wafer according to the modification, as with the separation initiating point forming step 102 of the methods according to the first and second embodiments, the laser beam 31 is applied to the wafer 1 while the Si ingot 11 is being pressed against the holding surface 34 of the chuck table 33 by the tape 20 or the second tape 22.

In the method of separating a wafer according to the modification, since the laser beam 31 is applied to the wafer 1 while the Si ingot 11 is being pressed against the holding surface 34 of the chuck table 33 by the tape 20 or the second tape 22, the Si ingot 11 is prevented from being warped and suffers reduced processing failures such as cracks, and the peel-off layer 6 can be formed as a separation initiating point at an appropriate position in the Si ingot 11.

In the separation initiating point forming step 102 according to the method of separating a wafer according to the modification, the orientation of the Si ingot 11 is adjusted such that the orientation flat 15 is inclined 45° to the X-axis direction, and the laser beam 31 is applied to the first surface 12 of the Si ingot 11 while the chuck table 33 is being moved in the X-axis direction, i.e., the first direction 8, forming a peel-off layer 6 within the Si ingot 11. According to the present invention, the processing feed direction along which Si ingot 11 or the wafer 1 is processing-fed with respect to the laser beam 31 is not limited to the directions indicated in the embodiments and modification described above. Moreover, inasmuch as the laser beam 31 is applied to the Si ingot 11 while the chuck table 33 is being moved along the direction inclined 45° to the orientation flat 15, it is easy for the cracks to extend in the Si ingot 11, allowing the indexing interval to increase and hence reducing the period of time required to process the Si ingot 11.

The present invention is not limited to the embodiments and modification described above. Various changes and modifications may be made in the embodiments and modification without departing from the scope of the invention. The laser beam applying unit 36 for applying the laser beam 31 to the wafer 1 or the Si ingot 11 should desirably include a liquid-crystal-on-silicon spatial light modulator (LCOS-SLM) that cancels out aberrations caused by the tapes 20 and 22 as a pressing member. Furthermore, the pressing member is not limited to the tapes 20 and 22 but may include a hard wafer, e.g., a glass wafer, that is transmissive of the wavelength of the laser beam 31.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of separating a wafer having a first surface and a second surface, opposite the first surface, held on a chuck table into at least two thinner wafers, the method comprising:
    a pressing member placing step of placing a pressing member that is transmissive of a wavelength of a laser beam on the first surface of the wafer such that the pressing member is pressed against the first surface of the wafer;
    after the pressing member placing step, a separation initiating point forming step of forming separation initiating points in the wafer by applying the laser beam, whose wavelength is transmittable through the wafer, to the wafer while positioning focused spots of the laser beam within the wafer and moving the focused spots and the wafer relatively to each other along a first direction;
    an indexing feed step of moving the focused spots and the wafer relatively to each other along a second direction perpendicular to the first direction;
    a separating step of separating the wafer at the separation initiating points into a first thinner wafer including the first surface and a second thinner wafer including the second surface; and
    a grinding step of grinding a surface of the second thinner wafer opposite the second surface held on the chuck table without releasing the second surface from the chuck table after the separating step.

2. The method of separating the wafer according to claim 1,
    wherein the separation initiating point forming step includes a step of branching the laser beam into a plurality of laser beams arrayed along the second direction perpendicular to the first direction.

3. The method of separating the wafer according to claim 1, wherein the pressing member includes a tape that is transmissive of the wavelength of the laser beam.

4. The method of separating a wafer according to claim 1, wherein in the separation initiating point forming step, the laser beam is applied through the pressing member.

5. The method of separating a wafer according to claim 1, further comprising a step of affixing a tape that is transmissive of the wavelength of the laser beam on the second surface of the wafer.

6. The method of separating a wafer according to claim 5, wherein in the separation initiating point forming step, the laser beam is applied through the tape on the second surface.

7. The method of separating a wafer according to claim 1, wherein in the pressing member placing step,
    a central portion of a first tape is affixed to the second surface of the wafer and an outer edge portion of the first tape is affixed to an annular frame, and
    a second tape having a diameter larger than the diameter of the wafer and smaller than the inside diameter of the annular frame, as the pressing member, is affixed to the first surface of the wafer at a central portion of the second tape and affixed to the first tape at an outer edge portion of the second tape.

8. A method of separating a wafer from a semiconductor ingot having a first surface and a second surface, opposite the first surface, held on a chuck table, the method comprising:
    a pressing member placing step of placing a pressing member that is transmissive of a wavelength of a laser beam on the first surface of the semiconductor ingot such that the pressing member is pressed against the first surface of the semiconductor ingot;
    after the pressing member placing step, a separation initiating point forming step of forming separation initiating points in the semiconductor ingot by applying the laser beam whose wavelength is transmittable through the semiconductor ingot to the semiconductor ingot through the pressing member while positioning focused spots of the laser beam within the semiconductor ingot and moving the focused spots and the semiconductor ingot relatively to each other along a first direction;
    an indexing feed step of moving the focused spots and the semiconductor ingot relatively to each other along a second direction perpendicular to the first direction, and
    a grinding step of grinding a surface of the second thinner wafer opposite the second surface held on the chuck table without releasing the second surface from the chuck table after the separating step;
    wherein the separation initiating point forming step includes a step of branching the laser beam into a plurality of laser beams arrayed along the second direction perpendicular to the first direction.

* * * * *